(12) United States Patent
Maruyama

(10) Patent No.: US 6,635,911 B2
(45) Date of Patent: Oct. 21, 2003

(54) SOLID STATE IMAGE SENSING DEVICE

(75) Inventor: Yasushi Maruyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 258 days.

(21) Appl. No.: 09/751,124

(22) Filed: Dec. 28, 2000

(65) Prior Publication Data
US 2002/0003230 A1 Jan. 10, 2002

(30) Foreign Application Priority Data
Dec. 28, 1999 (JP) .............................. 11-375013

(51) Int. Cl.$^7$ .............................. H01L 31/062
(52) U.S. Cl. ............... 257/291; 257/292; 257/294; 257/231; 257/232; 257/233
(58) Field of Search ............... 257/223, 229, 257/231, 232, 233, 242, 249, 291, 292, 294, 435, 443

(56) References Cited

U.S. PATENT DOCUMENTS 5,418,387 A  * 5/1995 Nakamura et al. .......... 257/231
5,581,099 A  * 12/1996 Kusaka et al. .............. 257/291

FOREIGN PATENT DOCUMENTS

JP         09-331055        * 12/1997

* cited by examiner

Primary Examiner—Minh Loan Tran
(74) Attorney, Agent, or Firm—Robert J. Depke; Holland & Knight LLC

(57) ABSTRACT

A solid state image sensing device and method of making same. The device includes a sensor portion, a vertical transfer register having a transfer electrode, a shunt interconnection of a refractory metal, and a light shielding film is provided. The shunt interconnection and the light shielding film are insulated from one another with an oxide film, an insulating film to serve as a stopper film at the time of pattering the oxide film is formed under the oxide film and the shunt interconnection, and the oxide film and the insulating film are not provided under the projecting portion of the light shielding film.

4 Claims, 8 Drawing Sheets

SOLID STATE IMAGE SENSING DEVICE

RELATED APPLICATION DATA

The present application claims priority to Japanese Application No. P11-375013 filed Dec. 28, 1999, which application is incorporated herein by reference to the extent permitted by law.

BACKGROUND OF THE INVENTION

1. Field of the Invention

The present invention relates to a solid state image sensing device such as a CCD solid state image sensing device and a manufacturing method thereof.

2. Description of the Background Art

In the manufacture of a typical CCD solid state image sensing device, a sensor portion and a CCD transfer channel for photoelectric conversion are formed at a semiconductor substrate, and a transfer electrode/storage electrode of for example polycrystalline silicon is formed in a part including the CCD transfer channel on the semiconductor substrate with a thin insulating film therebetween.

A light shielding film of an Al film for example is formed on the transfer electrode with an interlayer insulating film therebetween, so that light does not come into the transfer electrode and the underlying CCD transfer channel.

However, in order to insulate the transfer electrode/storage electrode and the conductive light shielding film, the interlayer insulating film must have a prescribed thickness, and the presence of the interlayer insulating film creates a gap between the surface of the sensor portion (the surface of the semiconductor substrate) and the light shielding film. As a result, incoming light between the surface of the sensor portion and the lower side of light shielding film leaks into the CCD transfer channel and results in smear.

The smear becomes worse as a function of the thickness of the interlayer insulating film.

Furthermore, a solid state image sensing device having a shunt interconnection connected with a transfer electrode in order to reduce the resistance of the transfer electrode and prevent propagation delay in transfer requires an interlayer insulating film to insulate between the shunt interconnection and the light shielding film. Therefore, the thickness of the insulating film under the light shielding film is even greater. As a result, the smear is worse than the case of the image sensing device without the use of the shunt interconnection.

In order to prevent the smear from becoming worse, a solid state image sensing device has been proposed which is produced by the following process: the transfer electrode/storage electrode and an interlayer insulating film thereon are formed, then an insulating film (oxide film) formed by oxidizing the interlayer insulating film and the substrate surface on the sensor portion is completely etched away, then again the substrate surface is oxidized to form a thin insulating film (oxide film), and an interlayer insulating film having a light shielding film formed thereon is formed on the thin interlayer insulating film.

In this structure, the insulating film under the portion of the light shielding film projecting on the sensor portion is only the thin insulating film formed by oxidizing the substrate surface, so that the gap between the surface of the sensor portion and the light shielding film can be reduced.

This allows the smear to be significantly reduced.

However, the solid state image sensing device having the above structure suffers from the following problems:

(1) A sufficient etching selectivity ratio cannot be secured between the oxide film on the substrate surface and the substrate.

(2) The etching process could damage the substrate. Dark current can be caused if such damage remains on the substrate.

(3) Side etch could be caused at the oxide film at the surface of the transfer electrode/storage electrode at the time of etching the oxide film on the surface of the substrate. If the oxide film on the surface of the transfer electrode is thinned by such side etch, a part of the polycrystalline silicon of the transfer electrode is likely to be oxidized as well in the next step of oxidizing the substrate surface. As a result, the transfer electrode is reduced, and the distance between the transfer channel and the transfer electrode in the substrate is increased, which reduces effective voltage, so that the transfer characteristic and the reading characteristic of pixels deteriorate.

SUMMARY OF THE INVENTION

In order to solve the above-described problems, it is an object of the present invention to provide a solid-state image sensing device which allows smear to be reduced and has various characteristics such as transfer and reading characteristics improved, and a method of manufacturing method thereof.

A solid state image sensing device according to the present invention includes sensor portions arranged in a matrix, a vertical transfer register having a transfer electrode provided for each column of the sensor portions, a shunt interconnection of a refractory metal connected to the transfer electrode and a light shielding film covering the transfer electrode. The shunt interconnection and the light shielding film are insulated from one another with an oxide film, an insulating film to serve as a stopper film at the time of patterning the oxide film is provided under the oxide film and the shunt interconnection, and the oxide film and the insulating film to serve as a stopper film are absent under a portion of the light shielding film projecting to the sensor portion side.

A method of manufacturing a solid state image sensing device according to the present invention includes the steps of forming a plurality of sensor portions and a vertical transfer register having a transfer electrode for each column of the sensor portions, forming an etching stopper film of an insulating film on a substrate covering the transfer electrode, forming a refractory metal film on the etching stopper film and patterning the refractory metal film to form a shunt interconnection layer, forming an oxide film on the substrate covering the shunt interconnection layer, etching away the oxide film on the sensor portion using the etching stopper film as an etching stopper, etching away the etching stopper film at least at a part on the sensor portion on the transfer electrode side, and forming a light shielding film covering the surface and forming an opening in the light shielding film on the sensor portion.

In the above-described structure of the solid state image sensing device according to the present invention, the shunt interconnection is formed of a refractory metal, and therefore an oxide film formed at a relatively high temperature can be used for an interlayer insulating film to cover the shunt interconnection for insulation from the light shielding film, so that the use of the oxide film allows the breakdown voltage to be raised.

Furthermore, the insulating film to serve as the etching stopper film at the time of patterning the oxide film is formed under the oxide film and the shunt interconnection, so that the insulating film on the surface of the substrate and around the transfer electrode is not damaged at the time.

In addition, under the portion of the light shielding film projecting to the sensor portion side, the oxide film and the insulating film to serve as an etching stopper film are not formed, so that the gap between the sensor portion and the projecting portion of the light shielding film can be reduced, and incoming leakage light which causes smear can be reduced.

By the manufacturing method according to the present invention, the etching stopper film of an insulating film is formed on the substrate covering the transfer electrode, and therefore the insulating film on the surface of the substrate or around the transfer electrode can be protected against damages by the etching stopper film at the time of pattering an oxide film to be subsequently formed.

The refractory metal film can be patterned to form a shunt interconnection layer, and therefore an oxide film formed at a relatively high temperature can be used for an interlayer insulating film covering the shunt interconnection for insulation from the light shielding film.

The use of the oxide film formed covering the shunt interconnection allows the breakdown voltage between the shunt interconnection and the light shielding film to be raised.

Furthermore, the oxide film on the sensor portion is etched away, then the etching stopper film is etched away at least at a part on the sensor portion on the transfer electrode side and a light shielding film having an opening on the sensor portion is formed, so that at the portion of the light shielding film projecting onto the sensor portion on the opening side, the light shielding film is formed after the oxide film and the etching stopper film are removed, and the gap between the projecting portion of the light shielding film and the sensor portion can be reduced.

DESCRIPTION OF THE PREFERRED EMBODIMENTS

The present invention provides a solid state image sensing device which includes sensor portions arranged in a matrix, a vertical transfer register having a transfer electrode provided for each column of the sensor portions, a shunt interconnection of a refractory metal connected to the transfer electrode and a light shielding film covering the transfer electrode. The shunt interconnection and the light shielding film are insulated from one another with an oxide film, an insulating film to serve as a stopper film at the time of pattering the oxide film is provided under the oxide film and the shunt interconnection, and the oxide film and the insulating film to serve as a stopper film are not formed under a portion of the light shielding film projecting to the sensor portion side.

Also according to the present invention, in the solid state image sensing device as described above, the insulating film to serve as a stopper film is formed at least at a part on the sensor portion.

The present invention provides a method of manufacturing a solid state image sensing device which includes the steps of forming a plurality of sensor portions and a vertical transfer register having a transfer electrode for each column of the sensor portions, forming an etching stopper film of an insulating film covering the transfer electrode, forming a refractory metal film on the etching stopper film and pattering the refractory metal film to form a shunt interconnection layer, forming an oxide film on a substrate covering the shunt interconnection layer, etching away the oxide film on the sensor portion, etching away the etching stopper film at least at a part on the sensor portion on the transfer electrode side, and forming a light shielding film on the substrate covering the oxide film on the shunt interconnection and forming an opening in the light shielding film on the sensor portion.

Also according to the present invention, in the method of manufacturing a solid state image sensing device as described above, in the step of etching away the etching stopper film, the etching stopper film is partly left on the sensor portion.

Also according to the present invention, in the method of manufacturing a solid state image sensing device as described above, the refractory metal film is formed on the etching stopper film with a protection film therebetween.

Figure 1:
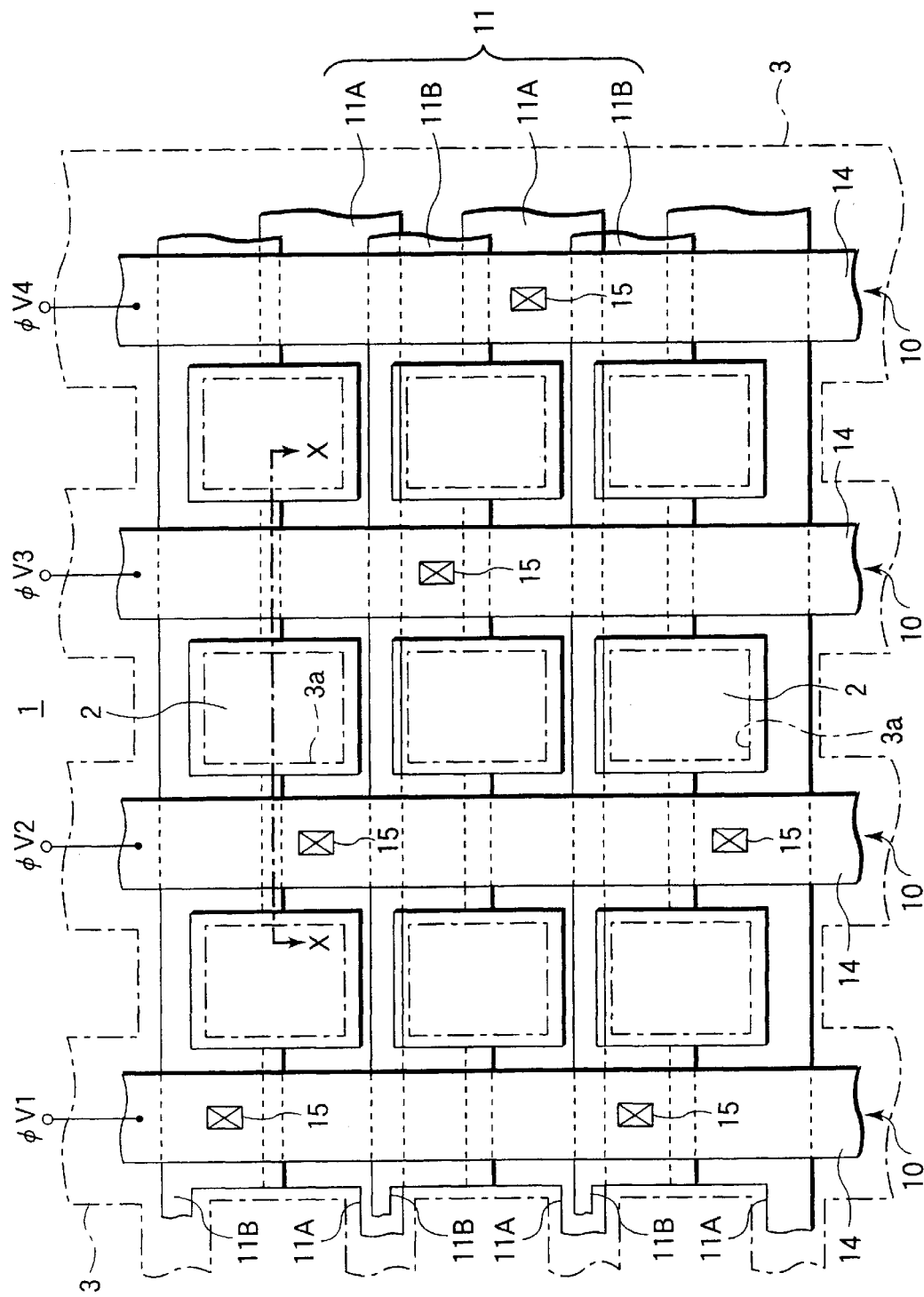
FIG. 1 is schematic view (plan view) of a CCD solid state image sensing device according to one embodiment of the present invention.
Figure 2:
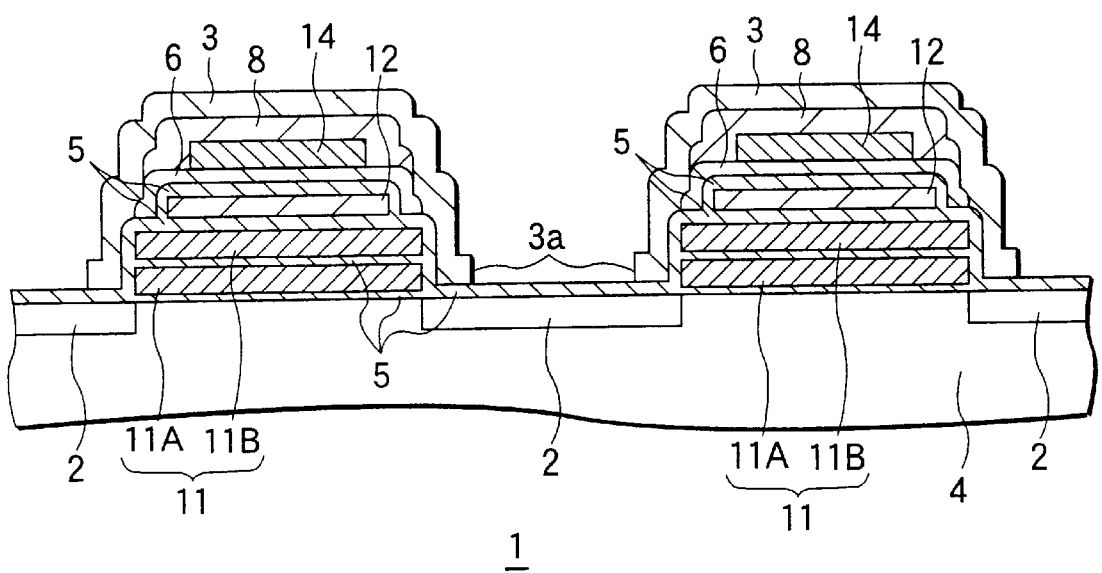
FIG. 2 is a sectional view taken along line X—X in FIG.

FIG. 1 is a schematic view (plan view of a main part) of a CCD solid state image sensing device according to one embodiment of the present invention. FIG. 2 is a sectional view taken along line X—X in FIG. 1.

The embodiment is an application of the invention to a CCD solid state image sensing device having vertical CCD registers driven in four phases.

In the CCD solid state image sensing device 1, a number of sensor portions (light receiving portions) 2 formed of photodiodes corresponding to pixels are arranged in a matrix, CCD type vertical transfer registers 10 each corresponding to one of the four phases are provided on one side of each column of the sensor portions 2 and a transfer electrode 11 (11A, 11B) including two polycrystalline silicon layers is supplied with driving pulses φV1, φV2, φV3 and φV4 in four different phases.

The transfer direction is in the vertical direction in FIG. 1 and the vertical transfer registers 10 are provided in this direction.

Note that the entire substrate is covered with a light shielding film 3, and an opening 3a is formed in the light shielding film 3 on the sensor portion 2 as shown by the chain line in the figure, so that light comes into the sensor portion 2 therethrough.

Each transfer electrode 11 (11A, 11B) is connected with a shunt interconnection 14 formed of a low resistance metal interconnection, i.e., a refractory metal film such as tungsten (W), molybdenum (Mo), tantalum (Ta) though a contact layer 15.

Thus, the line resistance of the transfer electrodes 11A, 11B can be reduced by the shunt interconnection 14, so that high speed transfer can be achieved.

Note that the shunt interconnection 14 is connected to the transfer electrode 11 (11A, 11B) at a part which is not shown through a buffer interconnection 12 for buffering composed of polycrystalline silicon.

The transfer electrode 11A includes a conductive line portion extending in the horizontal direction between the sensor portions 2 arranged in the vertical direction, and an electrode portion projecting upwardly in the figure along the vertical transfer registers 10. Meanwhile, the transfer electrode 11B includes a conductive line portion extending in the horizontal direction between the sensor portions 2 arranged in the vertical direction and an electrode portion projecting downwardly in the figure along the vertical transfer registers 10.

In FIG. 1, φV1, φV2, φv3 and φV4 denote driving pulses in the four phases each to be applied to a corresponding shunt interconnection 14 in a corresponding column.

The transfer electrode 11A in the lower, first layer is provided with the driving pulse φV2 or φV4 through the shunt interconnection 14, while the transfer electrode 11B in the upper, second layer is provided with the driving pulse φV1 or φV3 through the shunt interconnection 14.

As can be seen from the section shown in FIG. 2, the sensor portion 2 of a photodiode is provided on the surface of the semiconductor substrate 4 of silicon, for example, and the transfer electrode 11A of polycrystalline silicon in the lower, first layer is formed on the semiconductor substrate 4 with an oxide film 5 formed by thermal oxidation therebetween, on which the transfer electrode 11B of polycrystalline silicon in the upper, second layer is formed with the oxide film 5 therebetween.

The buffer interconnection 12 of polycrystalline silicon is formed on the upper layer, transfer electrode 11B with the oxide film 5 therebetween.

The oxide film 5 is formed on the surface of the buffer interconnection 12, on which a SiN film (nitride film ) 6 is formed as a first interlayer insulating film.

The shunt interconnection 14 of a refractory metal film described above is formed on the SiN film 6.

An oxide film 8 formed by CVD (Chemical Vapor Deposition) is provided on the shunt interconnection 14 as a second interlayer insulating film.

The light shielding film 3 having an opening 3a on the sensor portion 2 is formed on the oxide film 8. The light shielding film 3 is composed of an Al film or a refractory metal film such as tungsten (W), molybdenum (Mo), and tantalum (Ta).

Note that although not shown, a passivation film, a planarization film, a color filter, an on-chip lens and the like are formed as required in corresponding layers on the light shielding film 3.

Also, although not shown, a CCD transfer channel, a channel stop region and the like are formed in the semiconductor substrate 4.

Note that in the contact portion 15, although not shown, the oxide film 5 and the SiN film 6 on the buffer interconnection 12 are removed away so that the shunt interconnection 14 is formed in connection with the buffer interconnection 12.

In the CCD solid state image sensing device 1 according to the embodiment, only the relatively thin oxide film 5 is present between the projecting portion of the light shielding film 3 in the vicinity of the opening 3a on the sensor portion 2 and the semiconductor substrate 4, and therefore the gap is small.

This is because the SiN film 6 serving as the first interlayer insulating film and the oxide film 8 serving as the second interlayer insulating film are removed on the sensor portion 2. These SiN film 6 and oxide film 8 remain only on the transfer electrode 11 (11A, 11B).

In addition, the SiN film 6 serving as the first interlayer insulating film is formed between the shunt interconnection 14 and the buffer interconnection 12, so that a sufficient etching selectivity ratio can be secured at the time of patterning the second interlayer insulating film, i.e., the oxide film 8 covering the shunt interconnection 14. Meanwhile, the oxide film 5 on the sensor portion 2 and the oxide film 5 around the transfer electrodes 11A, 11B can be prevented from being damaged.

More specifically, the SiN film 6 acts as an etching stopper film at the time of patterning the oxide film 8.

Note that in this embodiment, the vertical transfer registers 10 are driven in the four phases, and there are the two transfer electrode layers, but the present invention is similarly applicable for example to the arrangement in which vertical transfer registers are driven in three phases and there are three transfer electrode layers.

Furthermore, the shunt interconnection 14 may be directly connected to the transfer electrode 11 without providing the buffer interconnection 12.

For example, the CCD solid state image sensing device 1 according to the embodiment can be manufactured as follows.

The transfer electrode 11A of the first layer polycrystalline silicon is formed on the semiconductor substrate 4 with the oxide film 5 therebetween, while the transfer electrode 11B of the second layer polycrystalline silicon is formed thereon with the oxide film 5 therebetween.

Then, the oxide film 5 is formed on the entire surface for example by CVD, the buffer interconnection 12 of polycrystalline silicon is formed on the transfer electrode 11B and the surface of the polycrystalline silicon film of the buffer interconnection 12 is thermally oxidized to form the oxide film 5.

The semiconductor substrate 4 is implanted with impurity ions using the transfer electrode 11 (11A, 11B) as a mask, and the sensor portion 2 of a photodiode is formed.

Figure 3A:
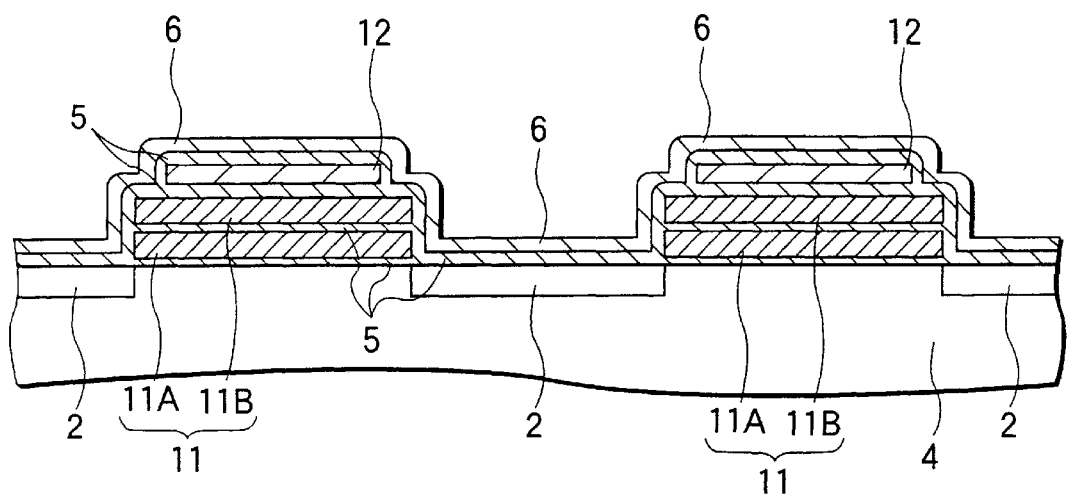
FIG. 3 includes views A and B showing the process of manufacturing the CCD solid state image sensing device shown in FIG. 1.

The SiN film 6 serving as the first interlayer insulating film is formed by reduced pressure CVD on the oxide film 5 formed on the buffer interconnection 12. This state is shown in FIG. 3A.

Figure 3B:
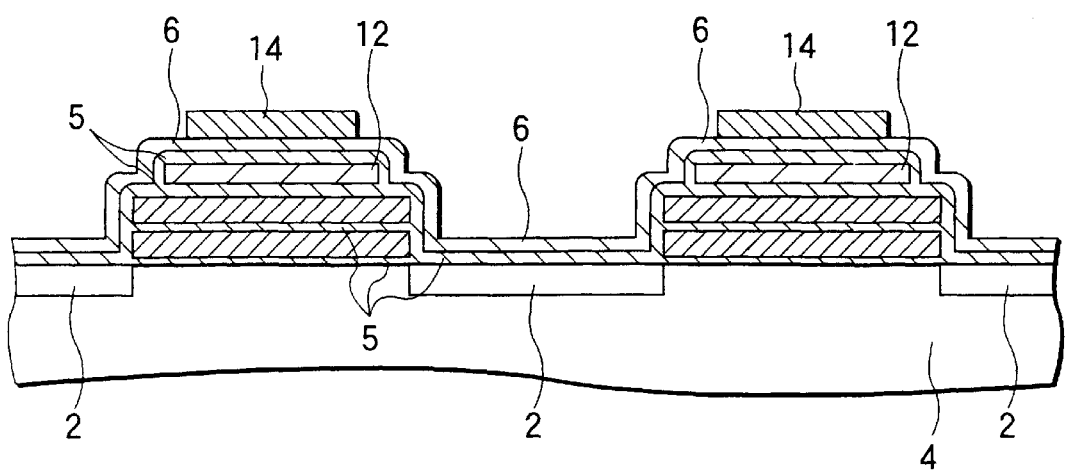

A refractory metal film such as tungsten (W) is formed on the entire surface of the SiN film 6, and as shown in FIG. 3B, the refractory metal film is etched into a prescribed pattern to form the shunt interconnection 14.

Note that in the contact portion 15, before forming the refractory metal film, the oxide film 5 and the SiN film 6 on the buffer interconnection 12 are removed. Thus, although not shown, the shunt interconnection 14 is formed in connection with the buffer interconnection 12.

Figure 4C:
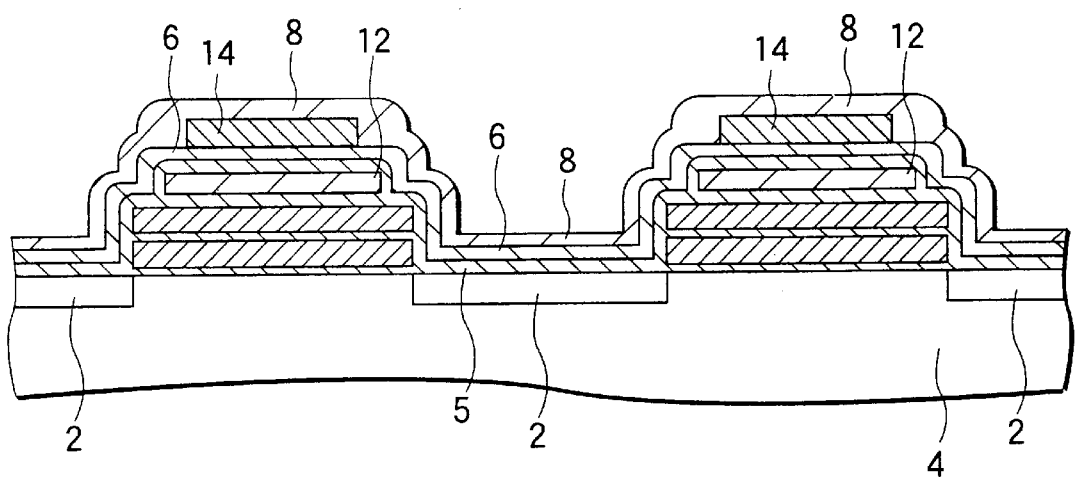
FIG. 4 includes views C and D showing the process of manufacturing the CCD solid state image sensing device shown in FIG. 1.

As shown in FIG. 4C, the oxide film 8 is formed by CVD entirely over the shunt interconnection 14.

Figure 4D:
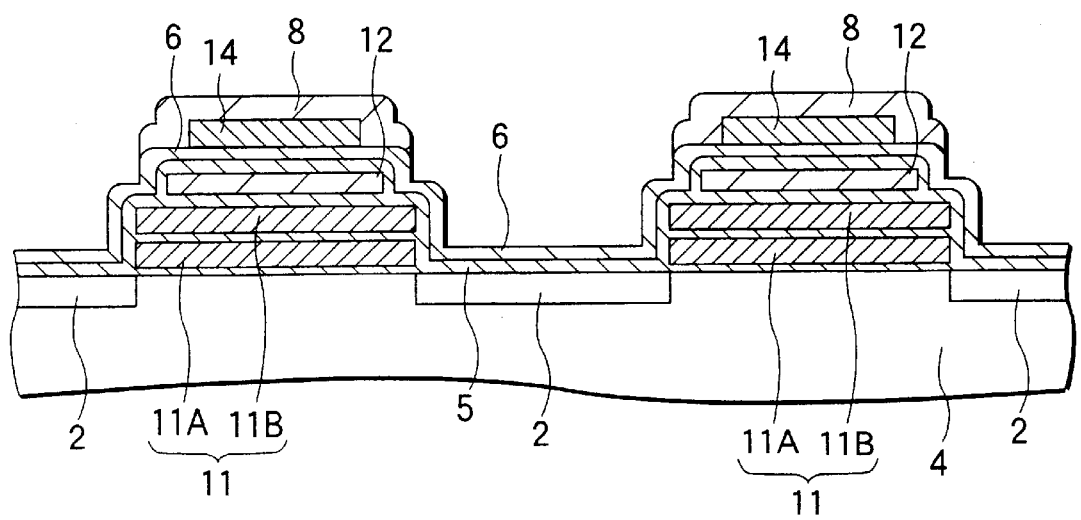

Subsequently, as shown in FIG. 4D, the second interlayer insulating film, i.e., the oxide film 8 on the sensor portion 2 is etched away. Thus, the oxide film 8 remains only on the transfer electrode 11.

At this time, the SiN film 6 is allowed to act as an etching stopper film, so that the oxide film 8 can be patterned well without damaging the oxide film 5 on the sensor portion 2 or around the transfer electrode 11.

Figure 5E:
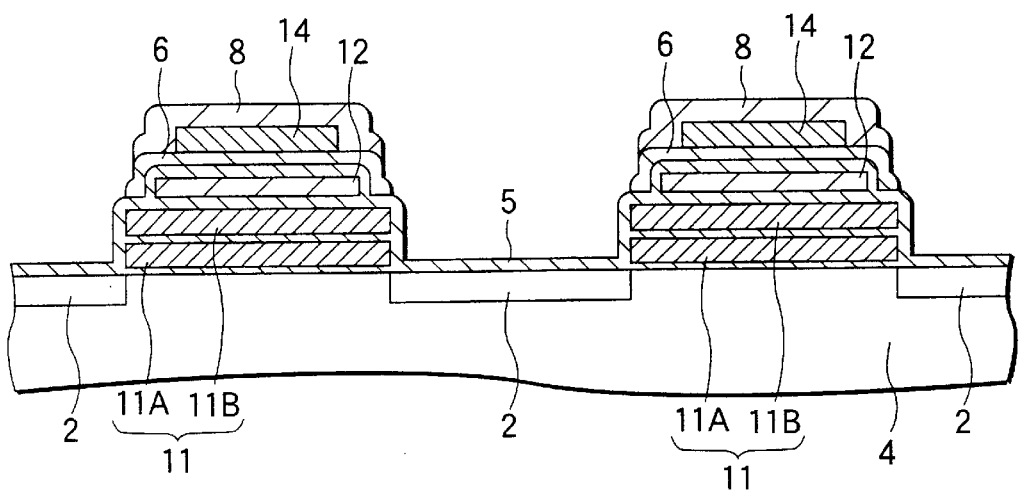
FIG. 5 includes views E and F showing the process of manufacturing the CCD solid state image sensing device shown in FIG. 1.

As shown in FIG. 5E, the first interlayer insulating film, i.e., the SiN film 6 on the sensor portion 2 is removed. Thus, the SiN film 6 remains only on the transfer electrode 11.

Figure 5F:
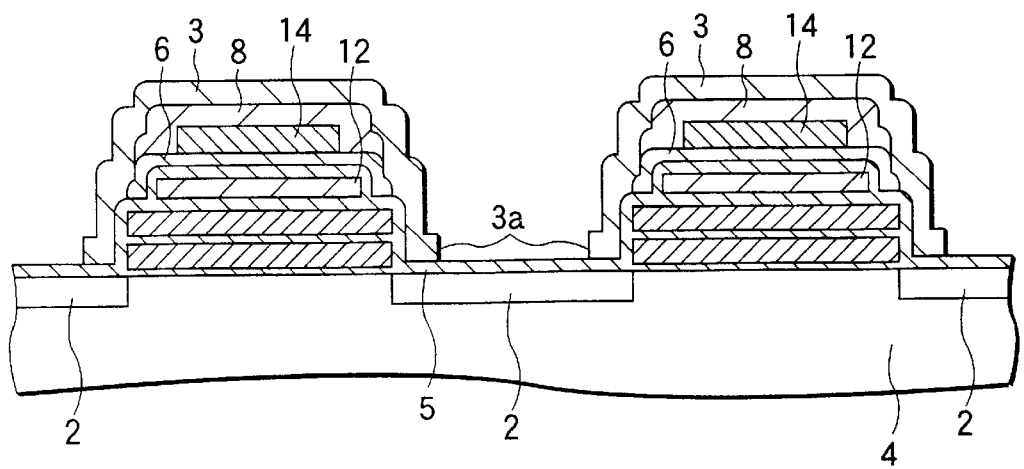

Furthermore, a metal film such as an Al film or a refractory metal film to be the light shielding film 3 is formed over the entire surface, the opening 3a is formed in the metal film on the sensor portion 2 by patterning, and as shown in FIG. 5F, the CCD solid state image sensing device 1 having the sectional structure as shown in FIG. 2 can be formed.

Only the thin oxide film 5 remains on the sensor portion 2, and the gap between the projecting portion of the light shielding film 3 in the vicinity of the opening 3a on the sensor portion 2 and the semiconductor substrate 4 is reduced.

Figure 6:
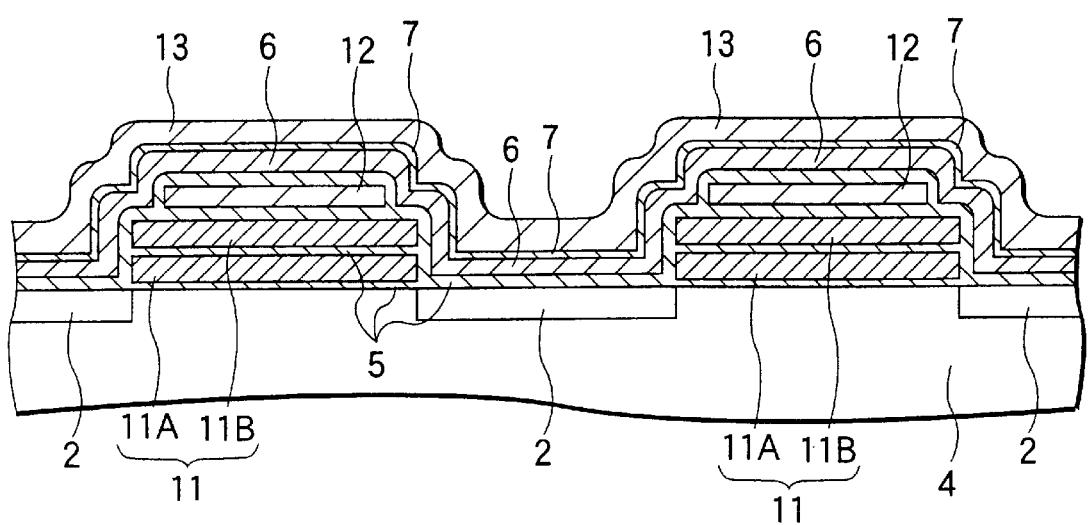
FIG. 6 is a view showing the step of forming an oxide film on a SiN film.

Note that before the step as shown in FIG. 3B and described above, a refractory metal film 13 to be the shunt interconnection 14 may be formed after forming an oxide film 7 to serve as a protection film on the SiN film 6 by CVD as shown in FIG. 6.

In this manner, at the time of patterning the refractory metal film 13, the SiN film 6 is protected by the oxide film 7 and therefore the SiN film 6 is not etched to be thin, in other words, the film 6 may have a sufficient thickness to act as an etching stopper in the subsequent steps. The oxide film 7 is etched at the time of patterning the refractory metal film 13 and becomes thinner than when it is formed.

Instead of forming the oxide film 7, the SiN film 6 may be formed to be thick enough in consideration of the thickness to be reduced.

According to the embodiment, since the SiN film 6 and the oxide film 8 are removed on the sensor portion 2, only the thin oxide film 5 remains between the sensor portion 2 and the light shielding film 3, so that the gap between the sensor portion 2 and the projection portion of the light shielding film 3 is reduced.

Therefore, light coming into the vertical CCD transfer channel through the gap can be reduced, so that smear can be reduced.

Furthermore, at the time of pattern-etching to remove the part of the oxide film 8 on the sensor portion 2, the SiN film 6 is allowed to act as an etching stopper.

Thus, the oxide film 5 around the transfer electrode 11 is not affected by the etching, and therefore the reading and transfer characteristics are not adversely affected.

Also in the sensor portion 2, the oxide film 5 on the semiconductor substrate 4 is not affected by the etching, and therefore crystal defects at the surface of the semiconductor substrate 4 do not increase. More specifically, dark current or white spots caused by crystal defects can be restrained.

As a result, good pattern etching can be achieved as the film to remain is well controlled.

Furthermore, the reading and transfer characteristics as well as the characteristics of the CCD solid state image sensing device 1 related to the dark current and white spots are not affected, and therefore elements with good characteristics can be stably provided in the manufacture of the CCD solid state image sensing device 1.

The use of the oxide film 8 formed by CVD for the second interlayer insulating film between the shunt interconnection 14 and the light shielding film 3 allows the breakdown voltage between the shunt interconnection 14 and the light shielding film 3 to be raised, so that breakdown voltage can be secured at the same level as that of the conventional devices if the thickness of the second interlayer insulating film is smaller the conventional devices.

As the SiN film 6 on the sensor portion 2 is removed, in other words, in the absence of the SiN film 6 which does not allow hydrogen to penetrate therethrough on the sensor portion 2, crystal defects can be repaired by supplying hydrogen into the semiconductor substrate 4 at the sensor portion 2.

Thus, the dark current or white spots caused by crystal defects can be reduced.

Note that more preferably, a refractory metal such as tungsten (W) is used for the light shielding film 3.

The use of a refractory metal for the light shielding film 3 allows the film 3 to be formed by CVD and in a dense state, which improves the light shielding characteristic as compared to Al and good coverage results, so that stepped disconnection over stepped portions is less likely to take place.

Therefore, light can be completely shielded by the light shielding film 3, and smear can be further reduced.

Also, the stepped disconnection is less likely, and therefore a good light shielding characteristic is secured if the light shielding film 3 is reduced in thickness.

According to the embodiment, since the oxide film 8 serving as the second interlayer insulating film and the like can be reduced in thickness, the total thickness of the CCD solid state image sensing device 1 can be reduced.

Thus, the ratio of height relative to area of the pixels can be reduced, so that diagonally directed light can more easily come into the sensor portion, and therefore the sensitivity can be improved.

Figure 7:
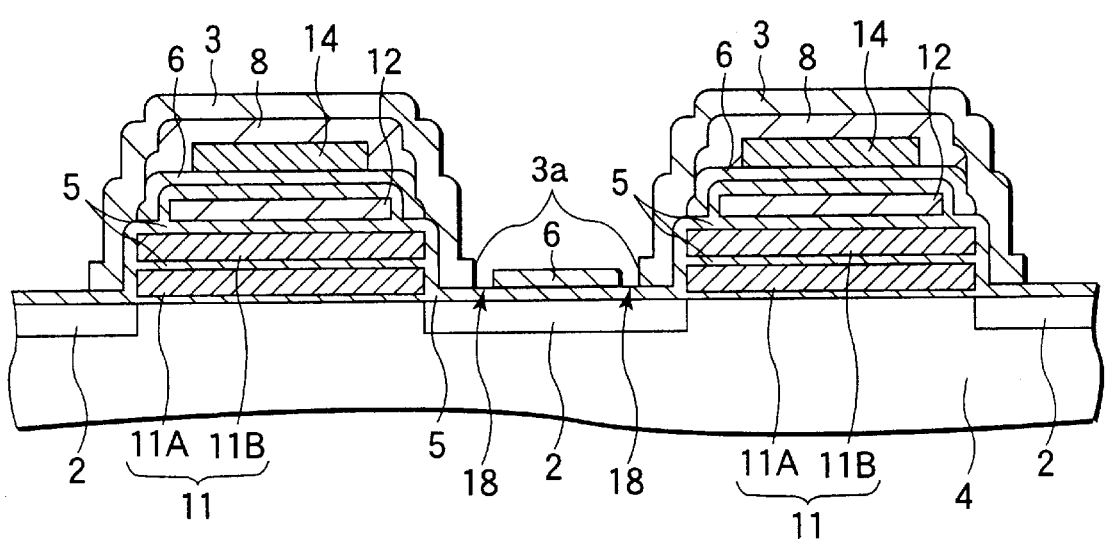
FIG. 7 is a sectional view showing the state in which a SiN film is left on a sensor portion.

As a result, the SiN film 6 may be partly left on the sensor portion 2 as shown in FIG. 7, and the remaining SiN film 6 may act as a low reflection film or anti-reflection film.

In this structure, the incoming light into the sensor portion 2 can be prevented by the SiN film 6 in order to improve the sensitivity.

In this case, after pattering the oxide film 8 as shown in FIG. 4D, resist is patterned to form a mask on the oxide film 8 and on the SiN film 6 on the sensor portion 2. Using the resist mask, the SiN film 6 may be patterned to remain on the transfer electrode 11 and on the sensor portion 2.

Note that at the part on the transfer electrode 11, the SiN film 6 may be patterned using the oxide film 8 as a mask without providing resist on the oxide film 8.

Note that in this case, an opening 18 is formed in the SiN film 6 on the sensor, and hydrogen is supplied into the semiconductor substrate 4 through the opening 18.

Figure 8:
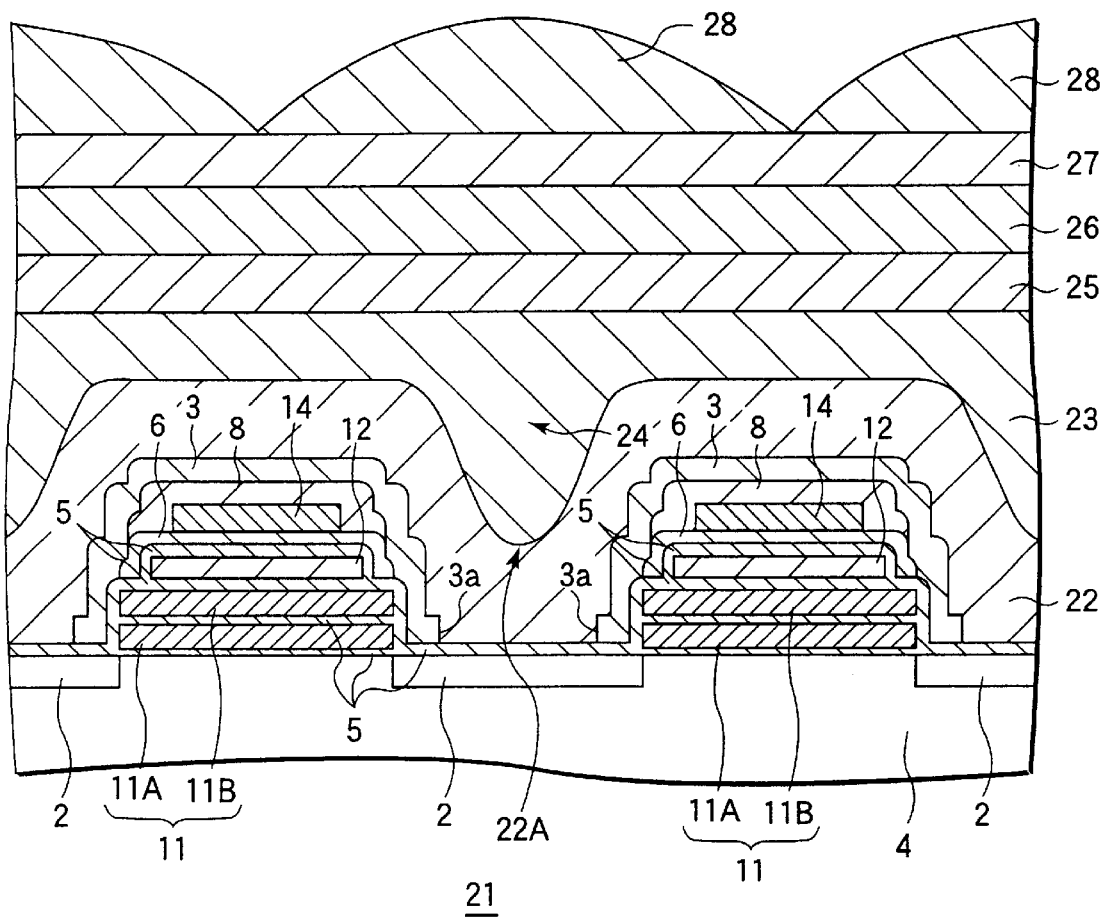
FIG. 8 is a sectional view of a CCD solid state image sensing device according to another embodiment of the present invention in the vicinity of the sensor portion.

FIG. 8 is a schematic view of a CCD solid state image sensing device (sectional view of pixels) according to another embodiment of the present invention.

The CCD solid state image sensing device 21 has an internal lens 24 formed of a high refractive index layer 23 on the sensor portion 2 in addition to the sectional structure of the CCD solid state image sensing device 1 according to the foregoing embodiment as shown in FIG. 2.

More specifically, glass 22 such as BPSG (borophosphosilicate glass) for example is formed on the entire surface of the light shielding film 3, and a concave surface 22A is formed on the part of the glass 22 on the sensor portion 2.

Furthermore, the high refractive index layer 23 of the SiN film formed by plasma CVD for example is formed on the glass 22, and an internal lens 24 using the concave surface of the glass 22 as a lens surface is formed on the sensor portion 2.

A passivation film 25 is formed on the high refractive index layer 23, and a color filter layer 26 is formed thereon. An on-chip lens 28 is further formed thereon with a planarization film 27 therebetween.

According to the embodiment, since the internal lens 24 formed by the high refractive index layer 23 is provided on the sensor portion 2, light collected by the on-chip lens 28 can be further collected by the internal lens 24, and can be effectively let into the sensor portion 2.

Therefore, the sensitivity of the CCD solid state image sensing device 21 can be improved.

Also according to the embodiment, the shunt interconnection 14 and the light shielding film 3 can be both formed using a refractory metal film.

Since the shunt interconnection 14 and the light shielding film 3 are formed using a refractory metal film, the glass 22 such as BPSG (borophosphosilicate glass) may be subjected to a thermal treatment step at a high temperature of 800° C. to 900° C. to form the concave surface 22A by reflow process, so that the internal lens 24 having the above-described structure can be formed.

Also as described above, the shunt interconnection 14 and the light shielding film 3 can be thinned by the use of the refractory metal film.

In the thermal treatment step, as the glass 22 is subjected to the reflow process, hydrogen contained in the glass 22 such as BPSG (borophosphosilicate glass) may be supplied into the semiconductor substrate 4, and the crystal defects in the semiconductor substrate 4 may be improved.

The present invention may be applied to a CCD solid state image sensing device of a frame interline transfer (FIT) type including a storage region to temporarily store signal charges between the image sensing area and the horizontal CCD register.

In the FIT type device, the SiN film 6 in the storage region is preferably entirely removed so that sufficient hydrogen can be supplied into the semiconductor substrate 4.

Thus, crystal defects in the semiconductor substrate 4 are repaired and dark current can be prevented from being generated in the storage region.

The present invention is by no means limited to the above-described embodiments, and can be modified in other various forms without departing from the gist and scope of the invention.

According to the present invention, under the projection portion of the light shielding film, the insulating film and oxide film to serve as an etching stopper film have been removed and are not present, and therefore only a thin insulating film remains between the sensor portion and the projecting portion of the light shielding film, so that the gap between the sensor portion and the projecting portion of the light shielding film is reduced.

Therefore, leakage light coming into the vertical transfer channel through the gap can be reduced, which can reduce smear.

Also, at the time of pattern-etching for removing the part of the oxide film on the sensor portion, the insulating film is allowed to act as an etching stopper film, which prevents the insulating film around the transfer electrode or on the semiconductor substrate from being affected by the etching, so that the reading and transfer characteristics are not adversely affected while crystal defects on the surface of the semiconductor substrate do not increase and dark current or white spots can be restrained as a result.

Therefore, good pattern etching can be achieved as the film to remain is well controlled. The characteristics of the solid state image sensing device are unchanged, and elements with good characteristics can be stably provided in the manufacture of the solid state image sensing device.

According to the present invention, the use of a refractory metal for the shunt interconnection permits an oxide film formed at a high temperature to be provided for an interlayer insulating film on the shunt interconnection.

The breakdown voltage between the shunt interconnection and the light shielding film can be increased by the use of the oxide film.

As a result, if the interlayer insulating film is formed to be thinner than the conventional devices, the breakdown voltage at the same level as that of the conventional devices can be secured.

Since the interlayer insulating film is reduced in thickness, which reduces the height of the solid state image sensing device, diagonally directed light may be let into the sensor portion to improve the sensitivity.

When a part of the insulating film to serve as an etching stopper film remains on the sensor portion, the remaining insulating film can be used as an anti-reflection film or low reflection film to prevent light from coming into the sensor portion, and the sensitivity may be improved.

When a refractory metal film for the shunt interconnection is formed on an etching stopper film with a protection film therebetween, the protection film can prevent the etching stopper film from being thinned at the time of patterning the refractory metal film, and a sufficient thickness for the film to act as the stopper film in the subsequent step of etching the oxide film can be maintained.

What is claimed is:

1. A solid state image sensing device, comprising:

sensor portions arranged in a matrix;

a vertical transfer register having a transfer electrode;

a shunt interconnection of a refractory metal connected to said transfer electrode; and a light shielding film covering said transfer electrode, said shunt interconnection and said light shielding film being insulated from one another with an oxide film, an insulating film to serve as a stopper film at the time of patterning said oxide film being provided under said oxide film and said shunt interconnection, said oxide film and said insulating film to serve as a stopper film being absent under portions of said light shielding film which are not located directly above the transfer electrode.

2. The solid state image sensing device according to claim 1, wherein said insulating film to serve as a stopper film is formed at least partially over said sensor portion.

3. The solid state image sensing device of claim 1, wherein the light shielding film extends away from the transfer electrode toward each of a plurality of said sensors.

4. A solid state imaging device comprising:

a vertical transfer register having a transfer electrode and a shunt interconnection;

a light shielding film covering said transfer electrode, said shunt interconnection and said light shielding film being insulated from one another with an oxide film, an insulating film to serve as a stopper film at the time of patterning said oxide film being provided under said oxide film and said shunt interconnection, said oxide film and said insulating film to serve as a stopper film being absent under portions of said light shielding film which are not located directly above the transfer electrode.

* * * * *